United States Patent
Ma et al.

(10) Patent No.: US 6,313,007 B1
(45) Date of Patent: Nov. 6, 2001

(54) SEMICONDUCTOR DEVICE, TRENCH ISOLATION STRUCTURE AND METHODS OF FORMATIONS

(75) Inventors: Yi Ma; Scott F. Shive, both of Orlando, FL (US); Melissa M. Brown, Austin, TX (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/589,816

(22) Filed: Jun. 7, 2000

(51) Int. Cl.[7] ........................................ H01L 21/76
(52) U.S. Cl. .......................... 438/424; 438/427; 257/510
(58) Field of Search .................................. 438/424, 427; 257/510

(56) References Cited

U.S. PATENT DOCUMENTS

| | | | |
|---|---|---|---|
| 5,473,186 | 12/1995 | Morita | 257/519 |
| 5,474,953 | 12/1995 | Shimizu et al. | 437/67 |
| 5,567,270 | 10/1996 | Liu | 156/644.1 |
| 5,717,628 | 2/1998 | Hammerl et al. | 365/149 |
| 5,753,561 | 5/1998 | Lee et al. | 438/424 |
| 5,780,346 | 7/1998 | Arghavani et al. | 438/296 |
| 5,789,769 | 8/1998 | Yamazaki | 257/263 |
| 5,872,045 * | 2/1999 | Lou et al. | 438/432 |
| 5,874,317 | 2/1999 | Stolmeijer | 437/67 |
| 5,923,993 * | 7/1999 | Sahota | 438/427 |
| 5,943,589 | 8/1999 | Ogushi | 438/407 |
| 5,985,735 * | 5/1999 | Moon et al. | 438/435 |
| 6,037,238 * | 5/2000 | Chang et al. | 438/426 |
| 6,048,775 * | 4/2000 | Yao et al. | 438/427 |
| 6,063,689 * | 5/2000 | Chen et al. | 438/424 |
| 6,118,168 * | 9/2000 | Moon et al. | 257/513 |

FOREIGN PATENT DOCUMENTS

2000133702-A * 5/2000 (JP) .

OTHER PUBLICATIONS

Lee et al Etch–Induced Damage in Singlr Crystal Si Trench Etching by Planar Inductively Coupled C12/N2 and C12/HBr Plasmas Thin Film Solids vol. 341 Nov. 1999.*

* cited by examiner

Primary Examiner—Charles Bowers
Assistant Examiner—David S Blum
(74) Attorney, Agent, or Firm—Schnader Harrison Segal & Lewis LLP

(57) ABSTRACT

A trench isolation structure is fabricated using high pressure and low temperature. A substrate is provided within which a trench is formed. The trench walls are annealed in nitrogen at a pressure above atmospheric pressure to remove silicon damage caused by plasma etching. The exposed side walls of the trench are oxidized at a pressure above atmospheric pressure to form an oxidized layer. The trench is filled with an oxide. Optionally, re-oxidation densification may be performed at a pressure above atmospheric pressure and a temperature in the range of about 600° C. to about 800° C.

36 Claims, 3 Drawing Sheets

SEMICONDUCTOR DEVICE, TRENCH ISOLATION STRUCTURE AND METHODS OF FORMATIONS

BACKGROUND OF THE INVENTION

1. Field of the Invention

This invention relates to a method of manufacturing semiconductor integrated circuits, and more particularly to a process for shallow trench isolation formation to achieve high device performance.

2. Background of the Invention

Semiconductor integrated circuit devices typically comprise silicon and multiple layers of vertically stacked metal interconnect layers with dielectric materials disposed between them. The fabrication of such devices typically involves the repeated deposition or growth, patterning, and etching of thin films of semiconductor, metal, and dielectric materials.

Isolation structures are commonly implemented in semiconductor manufacturing to electrically isolate circuit components from one another. Structures formed by the local oxidation of silicon (LOCOS) are effective but tend to produce a bird's beak structure profile which reduces available silicon estate. To reduce the silicon estate loss trench isolation may be implemented. Trenches, typically cut by a plasma etch, have more vertical walls than isolation structures formed by the LOCOS method, and are therefore, preferred for some applications. Generally, isolation structures comprise an oxide formed between diffused active regions of adjacent semiconductor components creating a barrier that prevents current flowing through one component from leaking into neighboring components.

The number of circuit components which can be included on a silicon substrate is limited by the size of the components and the available surface area of the silicon substrate. The active surface area is maximized by minimizing the isolation regions of the substrate. LOCOS isolation structures work well for components with dimensions greater than about one micron, but are not adequately suited for components with dimensions less than one micron.

Shallow trench isolation, or STI, structures have been developed for utilization in semiconductor devices with sub-micron dimensions. STI structures are typically defined within the substrate, rather than grown over the surface as with field oxide regions.

A prior art STI structure is shown in FIG. 1. Trench 1 is etched into substrate 2 between a pair of difflusion regions 3 and oxidation is performed at atmospheric pressure in dry oxygen at a temperature of about 900–1100° C. to form an oxide layer 5. High pressure techniques are typically used to form thick oxides which are generally oxides having a thickness greater than about 500 Å. Oxide layer 5 generally varies in thickness due, at least in part, to damage caused by plasma etching. A thermal oxidation step recovers damage on the side wall and bottom of the trench and reduces leakage. A silicon dioxide material 4 is deposited into trench 1 to substantially fill trench 1. Excess silicon dioxide material 4 remaining on the surface of substrate 2 is removed by chemical mechanical polishing of the surface, which results in a planarized surface. As shown in FIG. 1 a (an enlarged view of a portion of FIG. 1) the resulting trench 1 has facet formation 13 at the bottom corners. Trench 1 also has sharp edges 14 at the top corners as shown in FIG. 1b (an enlarged view of FIG. 1) and may have a bow-shaped side wall 7 as depicted in FIG. 1. The side wall bowing is mainly caused by plasma etching damage during trench formation and the following oxidation step. This occurs because damaged side walls oxidize faster than undamaged areas. The sharp edges 14 may be formed due to stress at the corners and a low oxygen diffusion coefficient.

Sharp edges 14 may diminish the structural integrity of substrate 2. Consequently, when subsequent layers are deposited over and into trench 1, dislocations in the silicon crystal are generated near and around sharp edges 14. Dislocations usually migrate deeper into lower portions of the substrate during subsequent thermal processing steps, such as annealing. As dislocations 6 migrate away from sharp edges 14, dislocations 6 form convenient paths for leakage currents. As a result, dislocations 6 can have the detrimental effect of providing an electrical conduction bridge that allows current flowing through one device to leak into an adjacent device.

In further processing, a dielectric layer 8 is typically deposited over the planarized surface. A conductive pattern 10 is then deposited over dielectric layer 8. The conductive pattern 10 may be polished polycrystalized silicon/tungsten silicide stacked materials. Sharp edges 14 tend to intensify the electric fields in dielectric layer 8, which causes bunching of electric field 12. The locally enhanced electric field 12 has a disadvantageous effect of dominating on-currents in transistor gates. As a result, transistor performance suffers because the transistor will tend to switch on at voltages lower than originally designed. The bunching of electric field 12 underlying sharp edges 14 also may adversely impact the integrity of dielectric layer 8. Consequently, dielectric layer 8 may break down at lower voltages or after less time.

A rounded corner at the mouth of the trench has been used to reduce silicon structure dislocations caused by subsequent depositions and to reduce the intensity of the electric fields generated over the STI structure and the leakage currents between isolated adjacent devices. The curved profile is made by anisotropically etching a blanket of silicon over a mask on the substrate to form temporary spacers having curved profiles at the side walls of an aperture. The temporary spacers transfer the curved profiles to a mouth of a shallow trench being etched at the region of the substrate as the temporary spacers are etched away. However, this method does not address dislocations at the bottom corners of the trench.

Another problem which negatively affects the electrical integrity of a semiconductor device is $p^+$ substrate up-diffusion. When a $p^-$ epitaxial silicon layer is on top of a $p^+$ layer, there is dopant diffusion up from the $p^+$ layer to the $p^-$ layer adversely affecting device performance. Up diffusion is more significant at higher temperatures and with thinner $p^-$ epitaxial layers. By reducing the thermal budget during device fabrication, up-diffusion may be minimnized.

Conventional STI formation methods may lead to the formation of sharp corners in the trench, which lead to leakage and device breakdown. Therefore, It is desirable to have a process for STI formation that achieves low thermal budget, better corner rounding, reduced leakage current, and suppressed $p^+$ substrate up-diffusion.

SUMMARY OF THE INVENTION

The invention includes a method of forming a shallow trench isolation structure using high pressure and low temperature, including the steps of (1) providing a substrate; (2) forming a trench in the substrate; (3) annealing the substrate in nitrogen at a pressure above atmospheric pressure to remove silicon damage; (4) oxidizing exposed side walls of the trench at a pressure above atmospheric pressure to form an oxidized layer; and (5) filling the trench with an oxide.

By virtue of the present inventive process, shallow trench isolation structures may be formed having rounded corners thereby reducing substrate breakdown and current leakage and suppressing p+ substrate up-diffusion.

BRIEF DESCRIPTION OF THE DRAWINGS

The invention is best understood from the following detailed description when read with the accompanying drawing figures. In keeping with the standard practice of the semiconductor industry, the various features may not be drawn to scale. The dimensions may be drawn out of scale to achieve clarity.

DETAILED DESCRIPTION

The invention will be understood more fully from the detailed description given below, which however, should not be taken to limit the invention to a specific embodiment, but is for explanation and understanding only.

Embodiments of the invention include a method for forming a trench isolation structure using high pressure and low temperature, including the steps of (1) providing a substrate; (2) forming a trench in the substrate; (3) annealing the substrate in nitrogen at a pressure above atmospheric pressure to remove silicon damage; (4) oxidizing exposed side walls of the trench at a pressure above atmospheric pressure to form an oxidized layer; and (5) filling the trench with an oxide.

Figure 1:
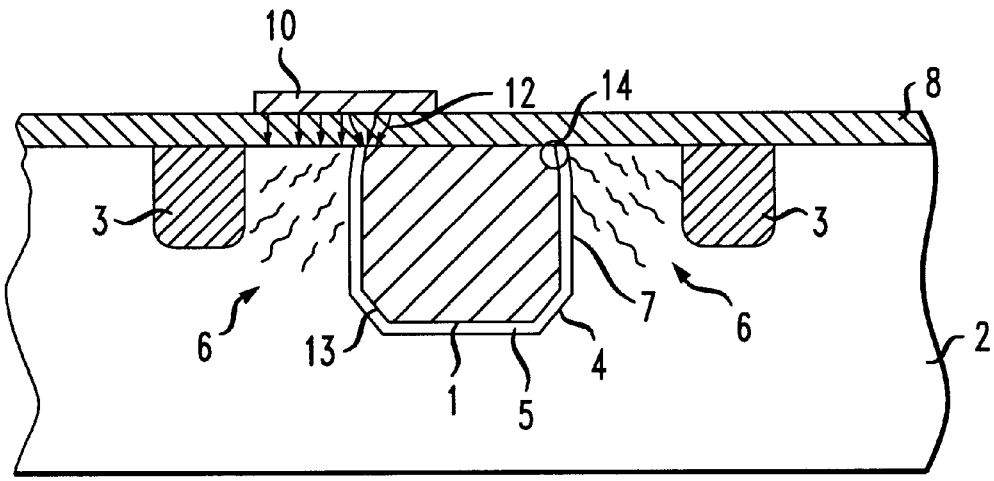
FIG. 1 is a cross-sectional view of a portion of a prior art STI structure.
Figure 1A:
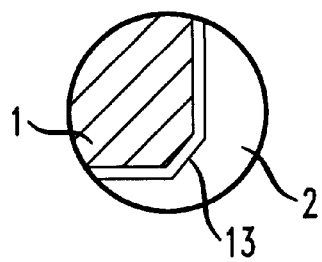
FIG. 1a is a cross-sectional view of facet formation on the bottom corners of the STI structure of FIG. 1.
Figure 1B:
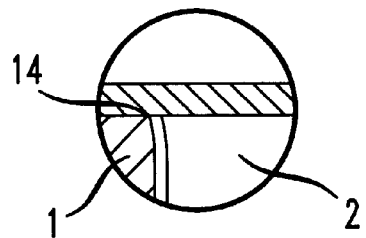
FIG. 1b is a cross-sectional view of sharp edges on the top corners of the STI structure of FIG. 1.
Figure 2A:
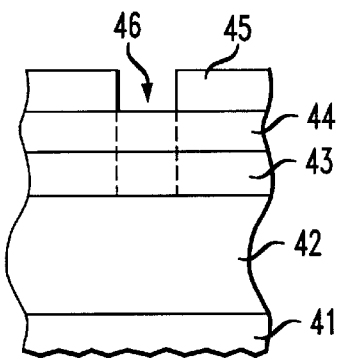
FIGS. 2a–d depict isolation trench formation.
Figure 2B:
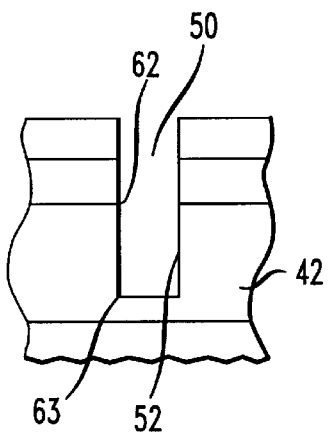
Figure 2C:
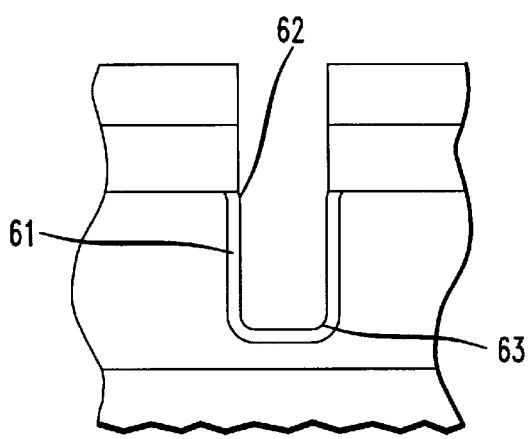

FIGS. 2a–d illustrate an embodiment the inventive method. FIG. 2a depicts a wafer 41 having a substrate 42, an oxide layer 43 formed on substrate 42, a nitride layer 44 formed on oxide layer 43, and a photoresist layer 45 formed on nitride layer 44. Nitride layer 44 is preferably a silicon nitride and is preferably formed by low pressure chemical vapor deposition. Photoresist layer 45 preferably has a thickness in the range of about 0.60 $\mu$m to 0.70 $\mu$m and more preferably of about 0.64 $\mu$m. Other thicknesses may be used and will depend in part on the type of photoresist and the compatibility with other process parameters. Photoresist layer 45 is typically patterned by transmitting radiation through a mask onto the photoresist. Assuming a positive resist is used, exposed areas 46 of the photoresist are then removed, preferably by oxygen plasma ashing. As shown in FIG. 2b, trench 50 is then formed by etching nitride layer 44, oxide layer 43 and substrate 42 in exposed area 46. Layers are generally etched by reactive ion etching. The layers may be etched in conjunction with other layers or each layer may be etched in a separate step using different etching methods. Preferably the nitride layer is etched by a plasma activated $CF_4$ and $H_2$ mixture, the oxide layer is preferably etched by plasma activated $CF_4$ and the trench is preferably etched by a plasma activated HBr and $NF_3$ mixture. The remaining photoresist 45 is then removed preferably by oxygen plasma ashing. The structure after trench 50 formation and removal of photoresist layer 45 is shown in FIG. 2b. Trench may have a depth in the range of about 0.1–0.8 $\mu$m with a preferred depth in the range of about 0.1 $\mu$m–0.3 $\mu$m and a most preferred depth of about 0.1 $\mu$m. It will be understood by those skilled in the art that the trench formation steps described thus far may be accomplished by a variety of deposition, masking and etching techniques, and thus all such techniques are within the spirit and scope of the invention.

Substrate 42 is then annealed in nitrogen, another inert gas, or combinations thereof to remove silicon damage caused, at least in part, by plasma etching. Annealing is performed at a pressure above atmospheric pressure and is preferably performed at a pressure in the range of about 2–25 atm, more preferably 5–20 atm and most preferably 14–16 atm. The annealing temperature is preferably less than about 1100° C., more preferably in the range of about 600–1095° C., and most more preferably in the range of about 800–1075° C. The annealing process reduces silicon damage. The nitrogen may be provided at a flow rate in the range of about 1–50 Standard Liters Per Minute (SLPM) and preferably, at a flow rate of 10 SLPM. The nitrogen may be diluted with oxygen. Side walls 52 may be cleaned prior to annealing.

The exposed side walls 52 of trench 50 are then oxidized at a pressure above atmospheric pressure, preferably in the range of about 2–25 atm, more preferably in the range of about 5–20 atm, and most preferably in the range of about 14–15 atm. The temperature at which oxidation is performed is preferably less than about 1100° C., more preferably in the range of about 600–1095° C., and most preferably at a temperature in the range of about 800–1075° C. This forms an oxidized layer 61, as shown in FIG. 4C. Exposed side walls 52 may be oxidized with oxygen at a flow rate of about 1–50 SLPK, preferably at aflow rate of 5–15 SLPK and most preferably at aflow rate of 10 SLPM. Exposed side walls 52 may also be oxidized with oxygen and inert gases, such as nitrogen, argon, or mixtures thereof, or by steam oxidation. Oxidized layer 61 formed from the oxidation preferably has a width in the range of about 100–500 Å, more preferably a width in the range of about 250 Å–450 Å, and most preferably a width of about 300 Å.

Figure 2D:
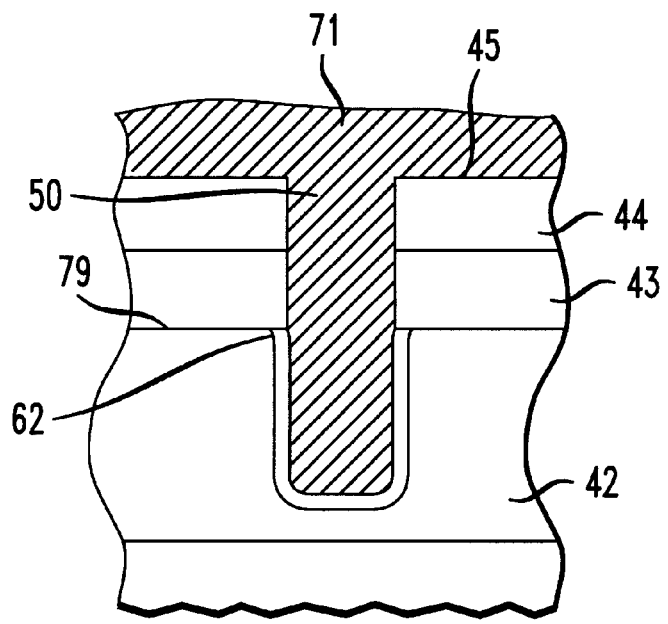
Figure 3:
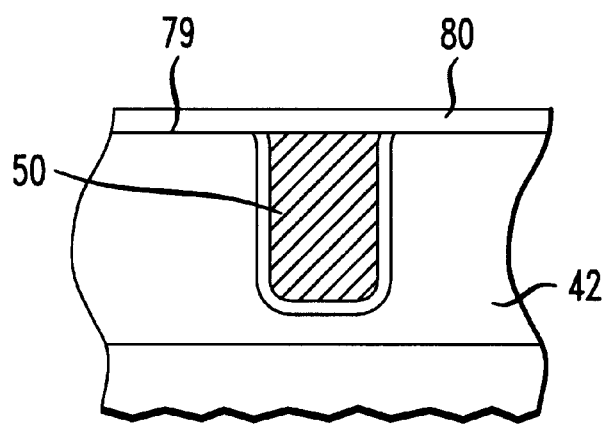
FIG. 3 is a cross-sectional view of a trench isolation structure.

Advantageously, the upper corners 62 and lower corners 63 are rounded during oxidation, reducing sharp corners and facet formation. Rounded upper corners 62 help prevent breakdown of substrate 42 that may be caused by sharp corners and their associated enhanced electric fields. Rounded lower corners 63 reduce junction leakage that is often associated with facet formation. After oxidation, trench 50 is filled with an oxide 71, such as silicon dioxide, preferably by high density plasma chemical vapor deposition as depicted in FIG. 2d. In one embodiment, re-oxidation densification is performed on oxide filling 71 in trench 50, at a pressure greater than atmospheric pressure, preferably in the range of about 2–25 atm, more preferably in the range of about 5–20 atm, and most preferably in a range of about 14–16. Re-oxidation is performed at temperature preferably less than about 1100° C., more preferably in the range of about 600–1095° C., and most preferably in the range of about 800–1075° C. The re-oxidation process forms a 10–5O Å equivalent oxide. Reoxidation densifies oxide 71 and further rounds the upper corners 62 of trench 50.

In a preferred embodiment of the invention annealing and oxidation are performed at a pressure of 15 atm and a temperature of less than 1100° C. Optionally re-oxidation densification may be performed, also at a pressure of 15 atm and a temperature of less than about 1100° C.

The resulting structure may be polished and planarized, preferably by chemical mechanical polishing (CMP) to substantially remove any unwanted oxide 71 from the trench above the plane defined by the upper surface 45 of nitride layer 44. After CMP, oxide and nitride layers 43 and 44 and a portion of oxide 71 generally above substrate 42 are removed. The nitride is preferably removed by sulphuric acid and the oxide is preferably removed by HF. As shown in FIG. 5, a gate oxide layer 80 may be formed over substrate 42 and trench 50 for use in formation of a semiconductor device component.

Embodiments of the invention are particularly useful for semiconductor devices, such as for example, logic, memory, or ASIC devices.

While the invention has been described with specificity, additional advantages and modifications will readily occur to those skilled in the art. Therefore, the invention in its broader aspects is not limited to the specific details shown and described herein. Accordingly, various modifications may be made without departing from the spirit or scope of the general inventive concept as defined by the appended claims and their equivalents. For example, the trench isolation formation may be applied to different types of circuits having different layers formed on top of the substrate with the trench formed therein.

What is claimed is:

1. A method of forming a trench isolation structure in a semiconductor device comprising:
   a. providing a substrate;
   b. forming a trench in the substrate;
   c. annealing the substrate in nitrogen at a pressure above atmospheric pressure to substantially remove silicon damage;
   d. oxidizing exposed side walls of the trench at a pressure above atmospheric pressure;
   e. filling the trench with an oxide; and
   f. wherein the pressure for the annealing is at least about 2 atm.

2. The method of claim 1 further comprising cleaning the side walls of the trench prior to annealing the substrate.

3. The method of claim 1 wherein the exposed side walls are oxidized at a temperature less than about 1100° C.

4. The method of claim 1 wherein the exposed side walls are oxidized at a temperature in the range of about 800–1075° C.

5. The method of claim 1 wherein the pressure for the oxidizing is between about 2–25 atm.

6. The method of claim 1 wherein the pressure for the oxidizing is in the range of about 14–16 atm.

7. The method of claim 1 wherein the exposed side walls are oxidized with oxygen at a flow rate in the range of about 1–50 SLPM.

8. The method of claim 1 wherein the exposed side walls are oxidized with oxygen at a flow rate in the range of about 5–15 SLPM.

9. The method of claim 1 wherein the exposed side walls are oxidized with oxygen and at least one type of inert gas.

10. The method of claim 9 wherein the inert gas is selected from the group consisting of nitrogen, argon, and mixtures thereof.

11. The method of claim 1 wherein the exposed side walls are oxidized by steam oxidation.

12. The method of claim 1 wherein the oxidized layer has a width of about 100–500 Å.

13. The method of claim 1 wherein the oxidized layer has a width in the range of about 250–450 Å.

14. The method of claim 1 wherein the annealing is performed at a temperature less than about 1100° C.

15. The method of claim 1 wherein the annealing is performed at a temperature in the range of about 800–1075° C.

16. The method of claim 1 wherein the pressure for the annealing is between about 2–25 atm.

17. The method of claim 1 wherein the pressure for the annealing is between about 14–16 atm.

18. The method of claim 1 wherein the nitrogen for the annealing is provided at a flow rate of about 1–50 SLPM.

19. The method of claim 1 wherein the nitrogen for the annealing is provided at a flow rate in the range of about 5–15 SLPM.

20. The method of claim 1 wherein the nitrogen for the annealing is diluted with oxygen.

21. The method of claim 1 wherein the trench has a width in the range of about 0.1 μm–0.3 μm.

22. The method of claim 1 wherein the trench has a depth in the range of about 0.1–0.8 μm.

23. The method of claim 1 further comprising re-oxidation densification of the oxide filling the trench at a pressure greater than atmospheric pressure.

24. The method of claim 23 wherein the re-oxidation densification is performed at a temperature less than about 1100° C.

25. The method of claim 23 wherein re-oxidation densification is performed at a temperature in the range of about 800–1075° C.

26. The method of claim 23 wherein re-oxidation is performed at a pressure in the range of about 2–25 atm.

27. The method of claim 23 wherein re-oxidation is performed at a pressure in the range of about 14–16 atm.

28. The method of claim 1 wherein the trench is filled with the oxide by high density plasma chemical vapor deposition.

29. The method of claim 1 wherein the trench is formed by reactive ion etching.

30. The method of claim 1 further comprising the steps:
   f. polishing a top surface of the nitride layer to substantially remove any unwanted oxide above the nitride layer top surface plane;
   g. removing the oxide and nitride layers and a portion of the oxide filling the trench to planarize a surface of the substrate; and
   h. forming a gate oxide layer over the substrate and the trench for use in formation of a semiconductor.

31. The method of claim 1 wherein the trench formation step comprises:
   a. providing a substrate;
   b. forming an oxide layer on the substrate;
   c. forming a nitride layer on the oxide layer;
   d. forming a photoresist layer over the nitride layer;
   e. patterning the photoresist layer;
   f. etching the oxide and nitride layers as patterned by the photoresist layer;
   g. removing the photoresist layer; and
   h. forming a trench in a region of the substrate as patterned by the oxide and nitride layers.

32. The method of claim 31 wherein the nitride layer is silicon nitride formed by liquid plasma chemical vapor deposition.

33. The method of claim 31 wherein the photoresist layer has a thickness in the range of about 0.6 μm to 0.7 μm.

34. The method of claim 31 wherein the photoresist layer is removed by an oxygen plasma etch.

35. A method of forming a trench isolation structure in a semiconductor device comprising:
   a. providing a substrate;
   b. forming a trench in the substrate;
   c. annealing the substrate in nitrogen at a pressure of about 15 atm and a temperature of less than about 1100° C. to substantially remove silicon damage;
   d. oxidizing exposed side walls of the trench at a pressure of about 15 atm. and a temperature of less than about 1100° C. to form an oxidized layer; and
   e. filling the trench with an oxide.

36. The method of claim 35 further comprising re-oxidation of the trench filling at a pressure of about 15 atm and a temperature of less than about 1100° C.

* * * * *